United States Patent
Rofougaran

(10) Patent No.: US 7,911,388 B2
(45) Date of Patent: Mar. 22, 2011

(54) METHOD AND SYSTEM FOR CONFIGURABLE ANTENNA IN AN INTEGRATED CIRCUIT PACKAGE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 539 days.

(21) Appl. No.: 11/954,779

(22) Filed: Dec. 12, 2007

(65) Prior Publication Data

US 2009/0153427 A1  Jun. 18, 2009

(51) Int. Cl.
*H01Q 1/38* (2006.01)

(52) U.S. Cl. .................. 343/700 MS; 343/876

(58) Field of Classification Search ........... 343/700 MS, 343/876
See application file for complete search history.

(56) References Cited

U.S. PATENT DOCUMENTS

| | | | |
|---|---|---|---|
| 6,060,433 A | 5/2000 | Li et al. | |
| 7,038,625 B1 | 5/2006 | Taylor et al. | |
| 2002/0122004 A1* | 9/2002 | Richards et al. | 343/700 MS |
| 2004/0041732 A1 | 3/2004 | Aikawa et al. | |
| 2004/0150554 A1 | 8/2004 | Stenger et al. | |
| 2004/0201526 A1* | 10/2004 | Knowles et al. | 343/700 MS |
| 2004/0222506 A1 | 11/2004 | Wei et al. | |
| 2005/0237237 A1* | 10/2005 | Lust et al. | 343/700 MS |
| 2006/0033671 A1 | 2/2006 | Chan et al. | |
| 2006/0077102 A1* | 4/2006 | Mohamadi | 343/700 MS |
| 2007/0013051 A1 | 1/2007 | Heyan et al. | |
| 2008/0291115 A1 | 11/2008 | Doan et al. | |

FOREIGN PATENT DOCUMENTS

| | | |
|---|---|---|
| EP | 1 146 592 | 10/2001 |
| WO | WO 2007/114620 | 10/2007 |

\* cited by examiner

*Primary Examiner* — HoangAnh T Le

(74) *Attorney, Agent, or Firm* — McAndrews, Held & Malloy, Ltd.

(57) ABSTRACT

Aspects of a method and system for a configurable antenna in an integrated circuit package are provided. In a hybrid circuit comprising an integrated circuit bonded to a multi-layer package, one or more antenna parameters may be adjusted by configuring a plurality of antenna elements via one or more switching elements. In this regard, the antenna elements and/or the switching elements may be within and/or on the multi-layer package and/or within the integrated circuit. The switching elements may be MEMS switches on and/or within the IC and/or the multi-layer package. The IC may be bonded or mounted to the underside of the package and signals may be communicated between the IC and the package via one or more solder balls. The IC may comprise suitable logic, circuitry, and/or code for configuring the antenna elements. The antenna elements may be configured based on desired polarization, antenna gain, and/or frequency.

20 Claims, 5 Drawing Sheets

METHOD AND SYSTEM FOR CONFIGURABLE ANTENNA IN AN INTEGRATED CIRCUIT PACKAGE

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for a configurable antenna in an integrated circuit package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is for a configurable antenna in an integrated circuit package, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a configurable antenna in an integrated circuit package. In a hybrid circuit comprising an integrated circuit bonded to a multi-layer package, one or more antenna parameters may be adjusted by configuring a plurality of antenna elements via one or more switching elements. In various exemplary embodiments of the invention, the antenna elements and/or the switching elements may be within and/or on the multi-layer package and/or the within the integrated circuit. Additionally, in various embodiments of the invention, the switching elements may be MEMS switches on and/or within the IC and/or the multi-layer package. Also, in an exemplary embodiment of the invention, the IC may be bonded or mounted to the underside of the package and signals may be communicated between the IC and the package via one or more solder balls. The IC may comprise suitable logic, circuitry, and/or code for configuring the antenna elements. In various exemplary embodiments of the invention, the antenna elements may be configured based on desired polarization, antenna gain, and/or frequency. Furthermore, a first configuration of said antenna elements may be utilized for receiving signals and a second configuration of said antenna elements may be utilized for transmitting signals. The multi-layer package may comprise one or more layers of ferromagnetic and/or ferrimagnetic material.

Figure 1:
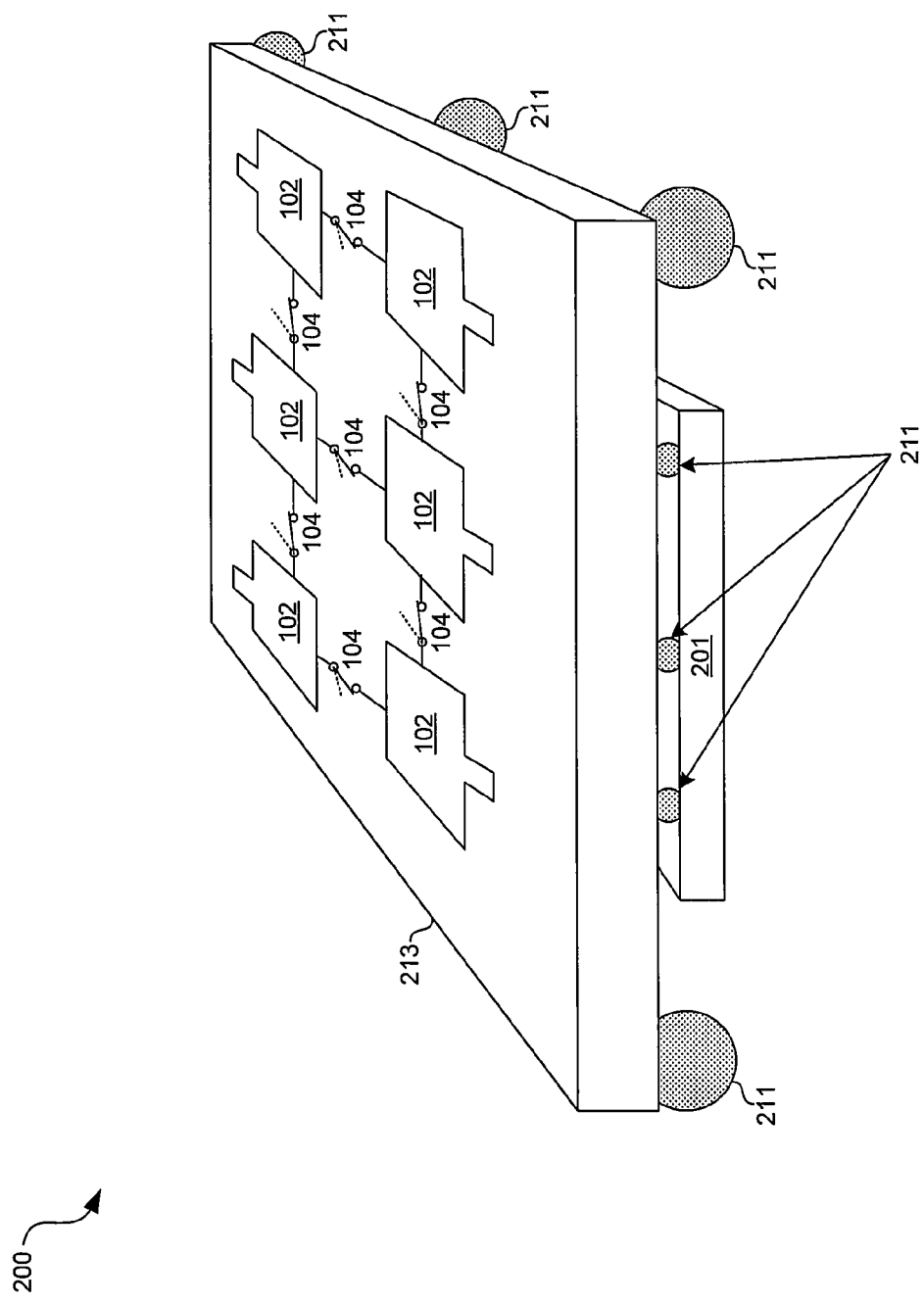
FIG. 1 is diagram illustrating a configurable antenna fabricated in an integrated circuit package, in accordance with an embodiment of the invention.

FIG. 1 is diagram illustrating a configurable antenna fabricated in an integrated circuit package, in accordance with an embodiment of the invention. Referring to FIG. 1, there is shown a hybrid circuit 200 (The hybrid circuit may also be referred to as a hybridized circuit, or a hybrid or hybridized package.) comprising a multi-layer integrated circuit (IC) package 213, an associated IC ("chip") 201, antenna elements 102, switching elements 104, and solder balls 211.

The IC 201 may comprise suitable logic, circuitry, and/or code for performing one or more functions associated with transmitting and/or receiving RF signals. In this regard, the IC 201 may comprise all or a portion of the system 420 described with respect to FIG. 4. In this regard, the IC may utilize a configurable antenna fabricated in the multi-layer integrated circuit package 213 for transmitting and/or receiving RF signals. In this regard, the IC 201 may comprise suitable logic, circuitry and/or code for configuring the antenna elements 102 via the switching elements 104.

The IC 201 may be bump-bonded or flip-chip bonded to the multi-layer IC package 213 utilizing the solder balls 211. In this manner, wire bonds connecting the IC 201 to the multi-layer IC package 213 may be eliminated, reducing and/or eliminating uncontrollable stray inductances due to wire bonds. In addition, the thermal conductance out of the IC 201 may be greatly improved utilizing the solder balls 211 and the thermal epoxy 221. The thermal epoxy 221 may be electrically insulating but thermally conductive to allow for thermal energy to be conducted out of the IC 201 to the much larger thermal mass of the multilayer package 213.

The solder balls 211 may comprise spherical balls of metal to provide electrical, thermal and physical contact between the IC 201 and the multi-layer IC package 213. In making the contact with the solder balls 211, the IC may be pressed with enough force to squash the metal spheres somewhat, and may be performed at an elevated temperature to provide suitable electrical resistance and physical bond strength. The solder balls 211 may also be utilized to provide electrical, thermal and physical contact between the multi-layer IC package 213 and a printed circuit board comprising other parts of, for example, the wireless system 420 described with respect to FIG. 4.

The multi-layer IC package 213 may comprise one or more layers of metal and/or insulating material. In this regard, the package 213 may be fabricated in a manner similar to or the same as the IC 201. Accordingly, the layers may be utilized to realize circuit exemplary elements comprising resistors, inductors, capacitors, transmission lines, switches, and antennas. In various embodiments of the invention, one or more switching elements 104 and one or more antenna elements 102 may be fabricated in the multi-layer IC package 213. Accordingly, a configurable antenna may be realized in the multi-layer IC package 213 wherein opening/closing the switches alters the receive characteristics of the antenna.

The antenna elements 102 may each be a metallic and/or conductive structure capable of coupling RF energy to/from, for example, the transceiver 423 described with respect to FIG. 420. The antenna elements 102 may be coupled, via switches 104, to form an overall antenna which may thus have a variety of shapes and sizes. In this manner, controlling the shape and size of the overall antenna may enable controlling exemplary characteristics of the antenna comprising center frequency, bandwidth, gain, and polarization. In various embodiments of the invention, each element may be rectangular, circular, and/or another shape. One or more of the elements may be coupled (by way of one or more vias and/or one or more metal layers) to one or more of the solder balls 211. In this manner, signals may be conveyed to/from the package 213.

The switching elements 104 may enable coupling/decoupling the antenna elements 102 from each other and/or one or more solder balls 211 thus altering the size and shape of the overall antenna. In various embodiments of the invention, the switching elements 104 may be micro-electro-mechanical (MEMS) switches.

In operation, suitable logic, circuitry, and/or code in the IC 201 and/or in another device coupled to the package 213 (e.g., located on a PCB and coupled via one or more of the solder balls 211) may control the switching elements 104 to realize a desired antenna characteristic. In this regard, the antenna elements 102 may be coupled/decoupled such that the shape and/or size of the overall antenna achieves a desired gain, center frequency, bandwidth, polarization, etc.

Figure 2A:
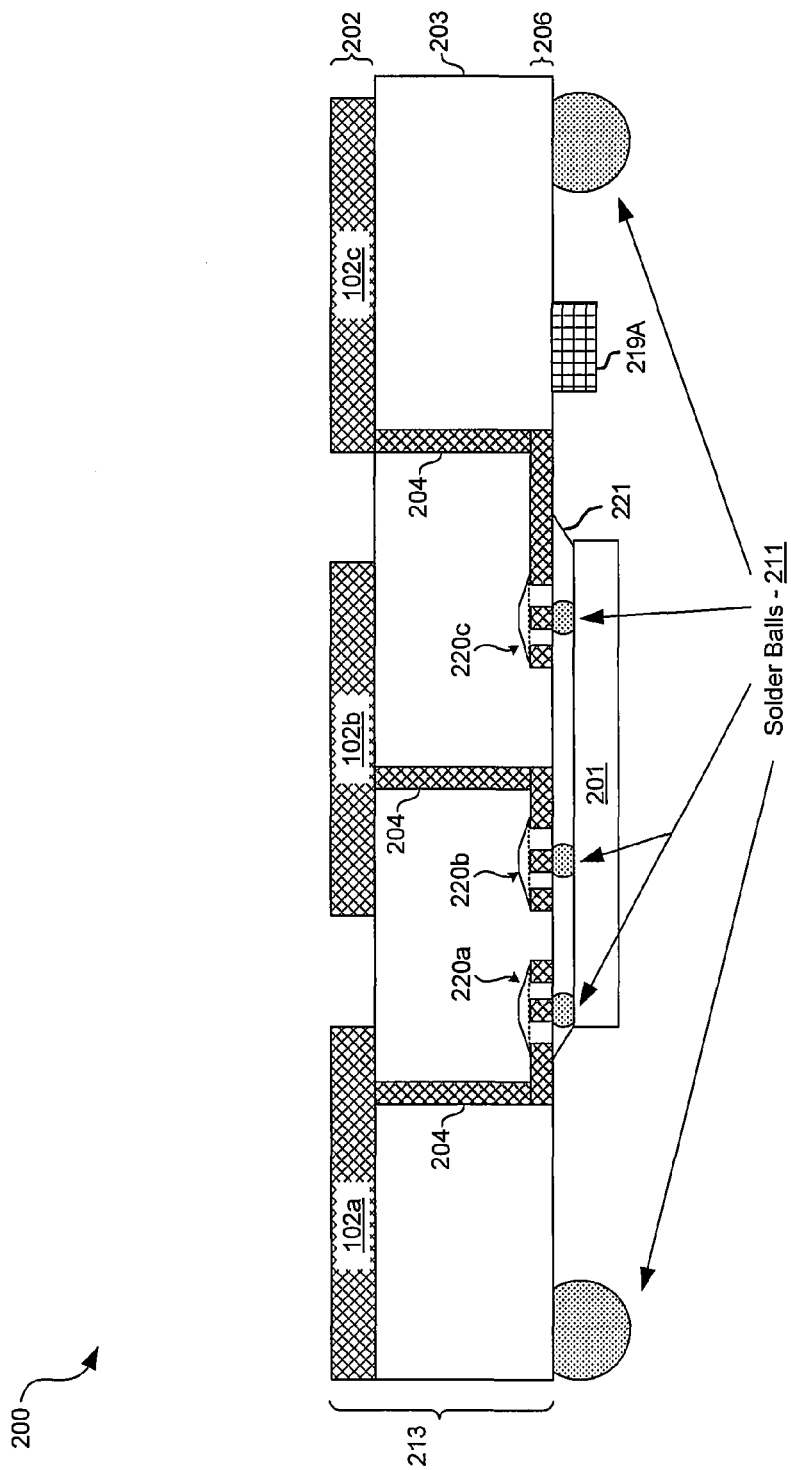
FIG. 2A is a diagram illustrating a cross sectional view of a multi-layer package with integrated configurable antenna, in accordance with an embodiment of the invention.

FIG. 2A is a diagram illustrating a cross sectional view of a multi-layer IC package with integrated configurable antenna, in accordance with an embodiment of the invention. Referring to FIG. 2A, there is shown a hybrid circuit 200 comprising a IC 201 and a multi-layer IC package 213. The multi-layer IC package 213 may comprise an insulating material 203, metal layers 202 and 206, vias 204, and MEMS switches 220a, 220b, and 220c. Additionally, in various embodiments of the invention, the multi-layer IC package may comprise one or more layers and/or areas of ferromagnetic and/or ferromagnetic material. The IC 210 may be coupled to the package 213, and the package 213 to a PCB (not shown), via solder balls 211. A surface mount component 219A may be mounted to the package 213, and thermal epoxy 221 may be pressed between the IC 201 and the package 213.

The IC 201 may be as described with respect to FIG. 1.

The solder balls 211 may be as described with respect to FIG. 1.

The surface mount device 219A may comprise a discrete circuit element such as resistors, capacitors, inductors, and diodes, for example. The surface mount device 219A may be soldered to the IC package 213 to provide electrical contact. In various embodiments of the invention, additional surface mount elements or no surface mount elements may be coupled to the package 213.

In an exemplary embodiment of the invention, the metal layer 202, may comprise a deposited metal layer utilized to delineate the antenna elements 102 described with respect to FIG. 1. In this regard, the metal layer 202 may be deposited in shapes and/or sizes which enable varying characteristics of the overall antenna characteristics (e.g., center frequency, bandwidth, gain, polarization).

In an exemplary embodiment of the invention, the vias 204 and the metal layer 206 may comprise deposited metal layers utilized to delineate waveguides, traces, and/or transmission lines which may couple the metal layer 202 to the solder balls 211. In this manner, signals may be conveyed to/from the antenna elements 102 in the metal layer 202.

In an exemplary embodiment of the invention, one or more MEMS switches 220 may be realized in the multi-layer IC package 213. In this regard, the MEMS switch 220 may close when, for example a magnetic field is induced on a switch terminal. In this regard, the MEMS switches 220 may each comprise a thin conductive element or film which when in the open position is suspended above a switch terminal (as indicated by the solid lines in FIG. 2) and when in the closed position is in contact with a switch terminal (as indicated by the dashed lines in FIG. 2). Accordingly, energizing the terminal, for example, may generate an attracting force that draws the element of film into contact with the terminal.

In operation, the IC 201 and associated package 213 may be utilized to transmit and/or receive RF signals. The IC 201 may be electrically coupled to a configurable antenna fabricated on and/or within the IC package 213. The overall antenna response may be configured via the switching elements 220. In this regard, each antenna element 102 may transmit and/or receive RF energy and that energy may be coupled to one of the solder balls 211 when a corresponding switch 220 is in the closed position. In this manner, logic, circuitry, and/or code in the IC 201 may select whether to utilize the antenna element 102a, 102b, and/or 102c, by closing switch 220a, 220b, and 220c, respectively. Accordingly, selecting the different combinations of the antenna elements 102 may enable achieving overall antenna characteristics. In various embodiments of the invention, additional devices (e.g., capacitors, inductors, resistors) may be integrated into the multi-layer IC package without deviating from the scope of the present invention.

In an exemplary embodiment of the invention, one or more circuit values (e.g., capacitance or inductance) may be adjusted and/or tuned via the surface mount devices. For example, a MEMS switch 220 may enable coupling or decoupling the surface mount devices to the IC 201. In various other embodiments of the invention, additional MEMS switches may be integrated in the multi-layer IC package 213 and may be utilized for coupling/decoupling integrated and/or surface mount components within/on the multi-layer IC package to other components within/on the package 213 and/or to the IC 210. Additionally, switching elements in the IC 201 may be utilized for coupling devices within the IC 201, within the multi-layer IC package 213, and between the multi-layer IC package 213 and the IC 201.

Figure 2B:
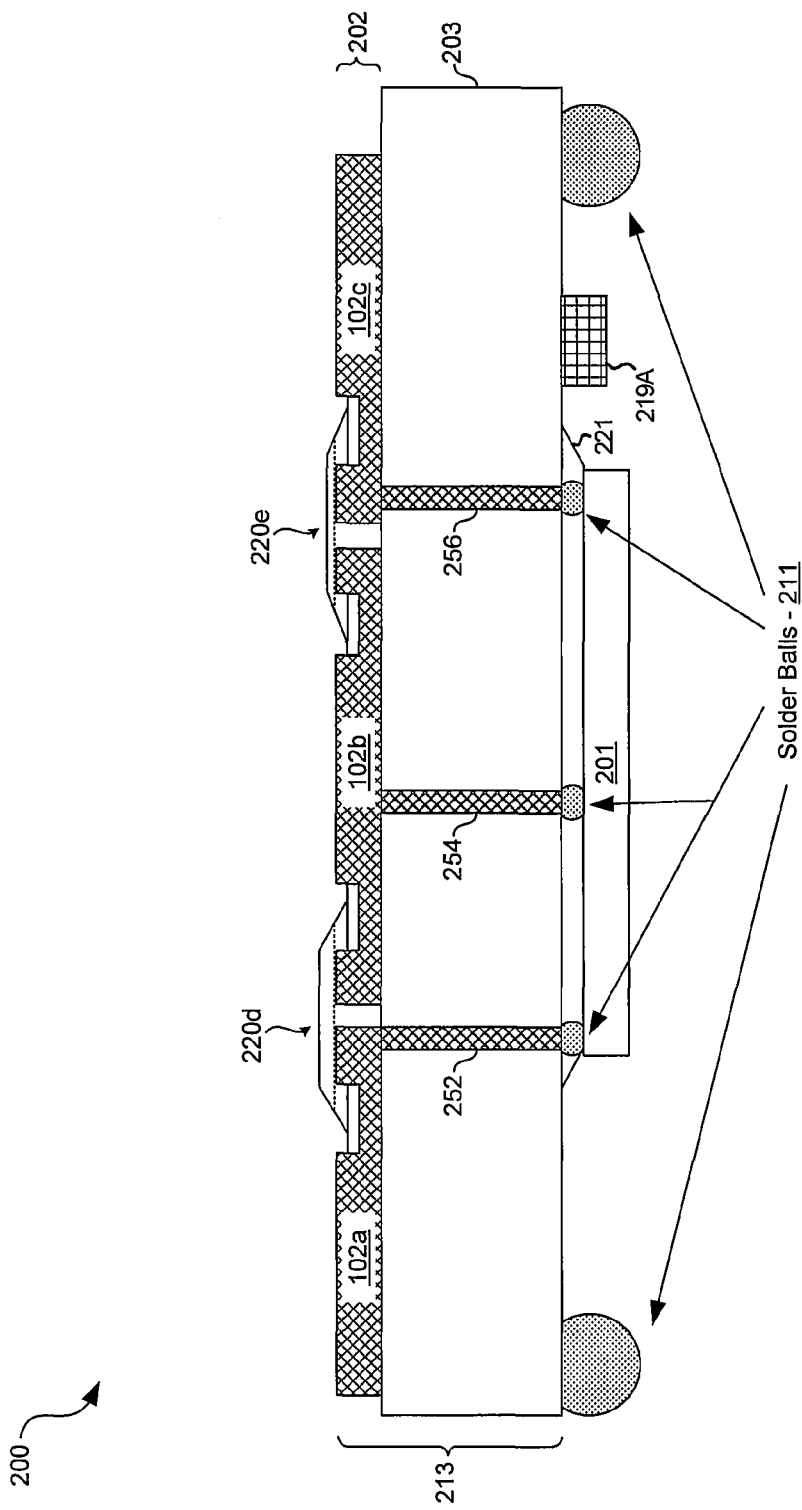
FIG. 2B is a block diagram illustrating a cross sectional view of a multi-layer package with integrated configurable antenna, in accordance with an embodiment of the invention.

FIG. 2B is a block diagram illustrating a cross sectional view of a multi-layer IC package with integrated configurable antenna, in accordance with an embodiment of the invention. Referring to FIG. 2B there is shown an IC 201 and associated package 213. The package 213 may comprise an insulating material 203, a metal layer 202, vias 252, 254, 256, and MEMS switches 220*d* and 220*e*. The IC 210 may be coupled to the package 213, and the package 213 to a PCB (not shown), via solder balls 211. A surface mount component 219 may be mounted to the package 213, and thermal epoxy 221 may be pressed between the IC 201 and the package 213.

The IC 201 may be as described with respect to FIG. 2A.

The multi-layer IC package 213 may be as described with respect to FIG. 1.

Antenna elements 102*a*, 102*b*, 102*c* may be fabricated in the metal layer 202. In this regard, the elements 102*a*, 102*b*, 102*c* may be as described with respect to FIG. 1. The antenna elements 102*a*, 102*b*, and 102*c* may be coupled and/or decoupled via the MEMS switches 220*d* and 220*e*.

The vias 252 and 255 may convey biasing and or control signals to the antenna elements 102*a* and 102*c*, respectively. Accordingly, the MEMS switches may be controlled by way of the vias 252 and 256. In one exemplary configuration, a magnetic charge may be induced on the antenna element 102*a* which may close (indicated by the dashed line) the MEMS switch 220*a*. In this manner, the overall antenna may comprise antenna elements 102*a* and 102*b*. In another configuration, both switches 220*d* and 220*e* may be closed such that the overall antenna comprises antenna elements 102*a*, 102*b*, and 102*c*.

The via 254 may convey received RF signals from the overall antenna or RF signals to be transmitted to the overall antenna. In this regard, the configuration of the MEMS switches 202*d* and 202*e* may alter the size, shape, polarization, etc. of the overall antenna and thus affect the reception/transmission characteristics of the antenna. For example, both MEMS switches 220*d* and 220*e* closed may improve antenna response at lower frequencies whereas both MEMS switches 220*d* and 220*e* open may improve antenna response at higher frequencies. Accordingly, selecting different combinations of the antenna elements 102 may enable achieving different antenna characteristics.

Figure 3:
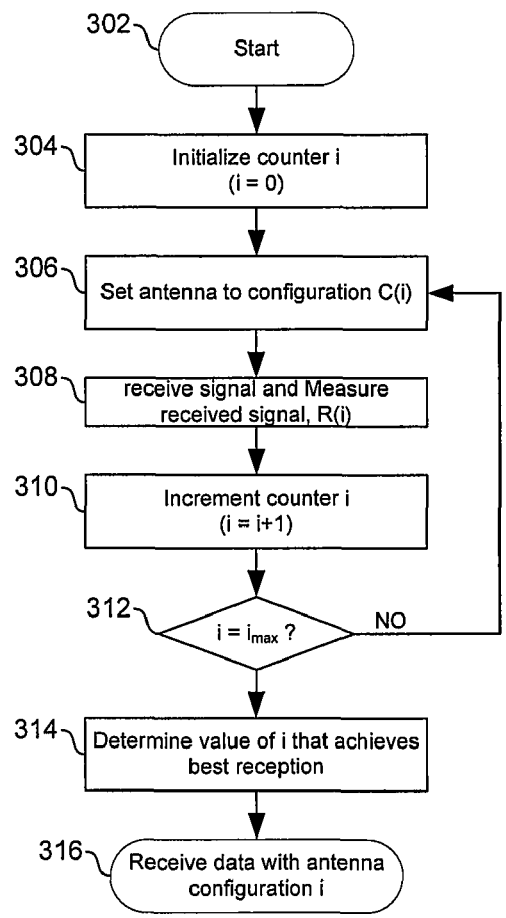
FIG. 3 is a flow chart illustrating exemplary steps for receiving signals utilizing a configurable integrated antenna, in accordance with an embodiment of the invention.

FIG. 3 is a flow chart illustrating exemplary steps for receiving signals utilizing a configurable integrated antenna, in accordance with an embodiment of the invention. Referring to FIG. 3 the exemplary steps may begin with step 302 when a receiver is ready to begin receiving signals. Subsequent to step 302, the exemplary steps may advance to step 304. In step 304, a counter, i, may be initialized to 0. In this regard, i may keep track of antenna configurations, and each combination of open and closed switches may correspond to a value of i. Accordingly, higher numbers of antenna elements and higher number of switches may correspond to a higher maximum value of i. Subsequent to step 304, the exemplary steps may advance to step 306.

In step 306, switch elements (e.g., 104 of FIG. 1, or 220 of FIGS. 2A and 2B) may be placed in a configuration which corresponds to the current value of i. In this regard, a memory (e.g. 427 of FIG. 4) may be utilized to map i to switch configurations. Subsequent to step 306, the exemplary steps may advance to step 308.

In step 308, a receiver (e.g. 423 of FIG. 4) may receive signals utilizing the antenna configuration corresponding to the current value of i. The transceiver may then measure the received signal (e.g., strength, signal to noise, presence of interference, etc.) and store results of the measurement to a memory (e.g. 427 of FIG. 4). Subsequent to step 308, the exemplary steps may advance to step 310.

In step 310, i may be incremented. Subsequent to step 310, the exemplary steps may advance to step 312. In step 312, it may be determined whether i is equal to a maximum value of i. In this regard, checking to see if i is equal to a maximum value may enable determining if all desired antenna configurations have been tried. For example, i may be equal to the total number of possible antenna configurations (which depends on the number of antenna elements and the number of switches). Alternatively, a subset of possible antenna configurations may be tried where, for example, it was previously determined that those configurations are most likely to provide the best reception. Subsequent to step 312, the exemplary steps may advance to step 314.

In step 314, it may be determined which value of i (i.e. which antenna configuration) resulted in the best reception. In this regard, in various embodiments of the invention, the antenna may be configured upon power up, upon changing a channel or frequency, when received signal strength drops below a threshold, periodically, etc. Subsequent to step 314, the exemplary steps may advance to step 316. In step 316, the determined best antenna configuration may be selected and signals may be received.

Steps similar to those described with respect to FIG. 3 may also be applied to determining an antenna configuration for transmitting signals.

Figure 4:
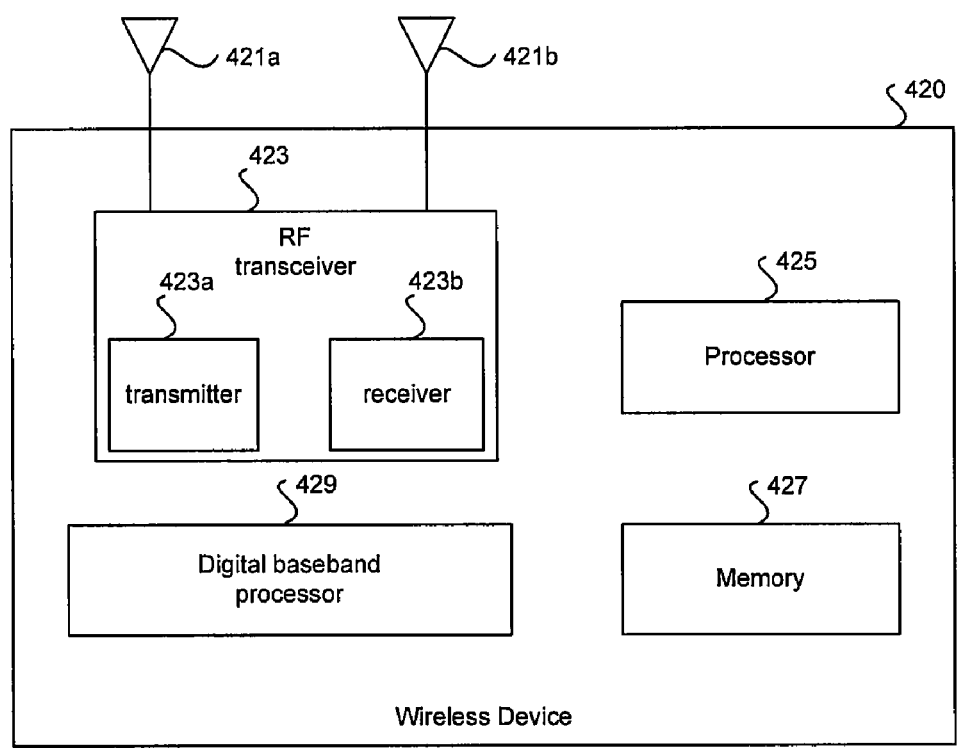
FIG. 4 is a block diagram illustrating an exemplary wireless device, in accordance with an embodiment of the invention.

FIG. 4 is a block diagram illustrating an exemplary wireless device, in accordance with an embodiment of the invention. Referring to FIG. 4, there is shown a wireless device 420 that may comprise an RF receiver 423*a*, an RF transmitter 423*b*, a digital baseband processor 429, a processor 425, and a memory 427. A receive antenna 421*a* may be communicatively coupled to the RF receiver 423*a*. A transmit antenna 421*b* may be communicatively coupled to the RF transmitter 423*b*. The wireless device 420 may be operated in a system, such as the cellular network and/or digital video broadcast network, for example.

The antenna(s) 421*a* and 421*b* may comprise one or more antenna elements, similar to or the same as the antenna elements 102 described with respect to FIG. 1, which may be coupled/decoupled via one or more switching elements, such as the MEMS switches 220 described with respect to FIGS. 2A, 2B. In this regard, the antennas 421*a* and 421*b* may share antenna elements and/or utilize different elements. For example, antenna 421*a* and 421*b* may utilize mutually exclusive antenna elements and switches which may enable simultaneous transmission and reception. Alternatively, a first configuration of antenna elements may be utilized to receive signals and a second configuration of antenna elements may be utilized to transmit signals, wherein one or more antenna elements is utilized in both the transmit and receive configurations.

The RF receiver 423*a* may comprise suitable logic, circuitry, and/or code that may enable processing of received RF signals. The RF receiver 423*a* may enable receiving RF signals in a plurality of frequency bands. For example, the RF receiver 423*a* may enable receiving signals in extremely high frequency (e.g., 60 GHz) bands. The receiver 423*a* may be enabled to receive, filter, amplify, down-convert, and/or perform analog to digital conversion. The RF receiver 423*a* may down convert a received RF signal. In this regard, the RF receiver 423*a* may perform direct down conversion of the received RF signal to a baseband or may convert the received RF signal to an intermediate frequency (IF). In various embodiments of the invention, the receiver 423a may perform quadrature down-conversion where in-phase components and quadrature phase components may be processed in parallel. The receiver 423a may be enabled to receive signals via the antenna 421a, which may be a configurable integrated antenna as described with respect to FIGS. 1, 2A, and 2B. In various embodiments of the invention, the wireless device 420 may comprise a plurality of the receivers 423a and may thus support multiple frequency bands and or simultaneous reception of signals in the same frequency band.

The digital baseband processor 429 may comprise suitable logic, circuitry, and/or code that may enable processing and/or handling of baseband signals. In this regard, the digital baseband processor 429 may process or handle signals received from the RF receiver 423a and/or signals to be transferred to the RF transmitter 423b, when the RF transmitter 423b is present, for transmission to the network. The digital baseband processor 429 may also provide control and/or feedback information to the RF receiver 423a and to the RF transmitter 423b based on information from the processed signals. In this regard, the baseband processor 429 may provide one or more control signals for configuring the antenna elements, via one or more switching elements, to realize the receive antenna 421a and/or the transmit antenna 421b. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423b for transmission to the network.

The RF transmitter 423b may comprise suitable logic, circuitry, and/or code that may enable processing of RF signals for transmission. The transmitter 423b may be enabled to transmit signals via the antenna 421b, which may be a configurable integrated antenna as described with respect to FIGS. 1, 2A, and 2B. The RF transmitter 423b may enable transmission of RF signals in a plurality of frequency bands. For example, the RF transmitter 423b may enable transmitting signals in cellular frequency bands. Each frequency band supported by the RF transmitter 423b may have a corresponding front-end circuit for handling amplification and up conversion operations, for example. In this regard, the RF transmitter 423b may be referred to as a multi-band transmitter when it supports more than one frequency band. In another embodiment of the invention, the wireless device 420 may comprise more than one RF transmitter 423b, wherein each of the RF transmitter 423b may be a single-band or a multi-band transmitter.

In various embodiments of the invention, the RF transmitter 423b may perform direct up conversion of the baseband signal to an RF signal. In some instances, the RF transmitter 423b may enable digital-to-analog conversion of the baseband signal components received from the digital baseband processor 429 before up conversion. In other instances, the RF transmitter 423b may receive baseband signal components in analog form.

The processor 425 may comprise suitable logic, circuitry, and/or code that may enable control and/or data processing operations for the wireless device 420. The processor 425 may be utilized to control at least a portion of the RF receiver 423a, the RF transmitter 423b, the digital baseband processor 429, and/or the memory 427. In this regard, the processor 425 may generate at least one signal for controlling operations within the wireless device 420. In this regard, the baseband processor 429 may provide one or more control signals for configuring the antenna elements, via one or more switching elements, to realize the receive antenna 421a and/or the transmit antenna 421b. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the antenna(s) 421a and 421b In this regard, the memory may store control and/or configuration information for configuring the antenna elements, via one or more switching elements, to realize the receive antenna 421a and/or the transmit antenna 421b.

Aspects of a method and system for configurable antenna in an integrated circuit package are provided. In a hybrid circuit (e.g., 200) comprising an integrated circuit (e.g., 201) bonded to a multi-layer package (e.g., 213), one or more antenna parameters may be adjusted by configuring a plurality of antenna elements (e.g., 102) via one or more switching elements (e.g., 104). In various exemplary embodiments of the invention, the antenna elements and/or the switching elements may be within the integrated circuit and/or within and/or on the multi-layer package. Also, the switching elements may be MEMS switches (e.g., 220) on and/or within the IC and/or the multi-layer package. The IC may be bonded or mounted to the underside of the package and signals may be communicated between the IC and the package via one or more solder balls (e.g., 211). The IC may comprise suitable logic, circuitry, and/or code for configuring the antenna elements. The antenna elements may be configured based on desired polarization, antenna gain, and/or frequency. A first configuration of said antenna elements may be utilized for receiving signals and a second configuration of said antenna elements may be utilized for transmitting signals. The multi-layer package may comprise one or more layers of ferromagnetic and/or ferrimagnetic material.

Another embodiment of the invention may provide a machine-readable storage, having stored thereon, a computer program having at least one code section executable by a machine, thereby causing the machine to perform the steps as described herein for configurable antenna in an integrated circuit package.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising: adjusting, in a hybrid circuit comprising an integrated circuit bonded to a multi-layer package, one or more antenna parameters by configuring via said integrated circuit a plurality of antenna elements using one or more switching elements, wherein said multi-layer package comprises said plurality of antenna elements and/or said one or more switching elements.

2. The method according to claim 1, wherein said switching elements are micro-electro-mechanical switches within and/or on said integrated circuit and/or said multi-layer package.

3. The method according to claim 1, comprising coupling said antenna elements in said multi-layer package to said integrated circuit via one or more solder balls.

4. The method according to claim 2, wherein said integrated circuit is mounted to the underside of said multi-layer package.

5. The method according to claim 4, configuring said antenna elements via logic, circuitry, and/or code in said integrated circuit.

6. The method according to claim 1, comprising configuring said antenna elements based on a desired polarization of received and/or transmitted signals.

7. The method according to claim 1, comprising configuring said antenna elements based on a desired antenna gain.

8. The method according to claim 1, comprising configuring said antenna elements based on a desired frequency band of received and/or transmitted signals.

9. The method according to claim 1, comprising utilizing a first configuration of said antenna elements for receiving signals and utilizing a second configuration of said antenna elements for transmitting signals.

10. The method according to claim 1, wherein said integrated circuit package comprises one or more layers of ferromagnetic and/or ferrimagnetic material.

11. A system for signal processing, the system comprising:
a hybrid circuit comprising an integrated circuit bonded to a multi-layer package; and
said hybrid circuit being enabled to adjust one or more antenna parameters by configuring via said integrated circuit a plurality of antenna elements using one or more switching elements, wherein said plurality of antenna elements and/or said one or more switching elements are within and/or on said multi-layer package.

12. The system according to claim 11, wherein said switching elements are micro-electro-mechanical switches within and/or on said integrated circuit and/or said multi-layer package.

13. The system according to claim 11, wherein said antenna elements in said multi-layer package are coupled to said integrated circuit via one or more solder balls.

14. The system according to claim 12, wherein said integrated circuit is mounted to the underside of said multi-layer package.

15. The system according to claim 14, wherein said integrated circuit comprises suitable logic, circuitry, and/or code for configuring said antenna elements.

16. The system according to claim 11, wherein said antenna elements are configured based on a desired polarization of received and/or transmitted signals.

17. The system according to claim 11, wherein said antenna elements are configured based a desired antenna gain.

18. The system according to claim 11, wherein said antenna elements are configured based a desired frequency band of received and/or transmitted signals.

19. The system according to claim 11, wherein a first configuration of said antenna elements is utilized receiving signals and a second configuration of said antenna elements is utilized for transmitting signals.

20. The system according to claim 11, wherein said integrated circuit package comprises one or more layers of ferromagnetic and/or ferrimagnetic material.

* * * * *